United States Patent [19]

Kim et al.

[11] Patent Number: 5,137,843
[45] Date of Patent: Aug. 11, 1992

[54] ISOLATION METHOD FOR SEMICONDUCTOR DEVICE

[75] Inventors: Byeong-ryeol Kim, Suwon; Cheon-su Pan, Seoul, both of Rep. of Korea

[73] Assignee: Samsung Electronics Co., Ltd., Kyunggi, Rep. of Korea

[21] Appl. No.: 674,239

[22] Filed: Mar. 25, 1991

[30] Foreign Application Priority Data

Dec. 22, 1990 [KR] Rep. of Korea .................... 90-21503

[51] Int. Cl.$^5$ ............................................. H01L 21/76
[52] U.S. Cl. ....................................... 437/70; 437/72; 437/931
[58] Field of Search ................ 437/70, 72, DIG. 931, 437/DIG. 76, DIG. 83

[56] References Cited

U.S. PATENT DOCUMENTS

| H204 | 2/1987 | Oh et al. | 437/72 |
| 4,820,654 | 4/1989 | Lee | 437/90 |

FOREIGN PATENT DOCUMENTS

| 63-253640 | 10/1988 | Japan | 437/72 |
| 63-300526 | 12/1988 | Japan | 437/70 |
| 210729 | 1/1990 | Japan | 437/70 |
| 2117150 | 5/1990 | Japan | 437/70 |

Primary Examiner—Olik Chaudhuri
Assistant Examiner—G. Fourson
Attorney, Agent, or Firm—Rothwell, Figg, Ernst & Kurz

[57] ABSTRACT

An isolation method for a semiconductor device, and comprises the steps of: sequentially forming a first silicon nitride film, an oxide film, and a second silicon nitride film on a substrate and forming an opening to define an isolation region between devices; forming a spacer at the edges of the opening and implanting impurities in the substrate; removing the exposed part of the first silicon nitride film, and then removing the spacer; growing a field oxide film, and sequentially removing the second silicon nitride film, the oxide film, and the first silicon nitride film. In a second embodiment, the first silicon nitride film and part of the substrate are removed, and then the spacer is removed during the process of removing the exposed part of the first silicon nitride film and the spacer. Accordingly, the depth to which the field oxide film is buried is controlled by the etching depth of the substrate, thereby increasing the effective isolation distance. Also, the so-called bird's beak effect can be reduced to minimize the isolation region, and the stress at the edge of the field oxide film is lighter reducing the occurrence of the crystal defects and improving such isolation characteristics as leakage current.

15 Claims, 7 Drawing Sheets

ISOLATION METHOD FOR SEMICONDUCTOR DEVICE

FIELD OF THE INVENTION

The present invention relates to an isolation method for a semiconductor device and more particularly to an isolation method for a semiconductor device which can minimize the size of an isolation region between devices on the same substrate.

BACKGROUND OF THE INVENTION

In recent years, as semiconductor device integration has increased, techniques for the reduction of the isolation region in semiconductor integrated circuits, which is an important element in miniaturization, have been actively studied. In particular, in memory devices of large capacities, the dimension of the isolation region is a major factor in determining memory cell size. The isolation region is necessary to prevent current flow between separate devices, such as transistors, that are located on the same substrate. However, since the isolation region does not play an active role electronically, its size should be minimized.

A conventional isolation technique is the LOCOS (LOCal Oxidation of Silicon) method, selectively growing a thick field oxide film on a semiconductor substrate and forming an isolation region. But, when the selected field oxide film is grown, so-called called bird's beak portions form from which extends the isolation regions towards the active element's regions, thereby expanding the dimensions of the isolation region. Therefore, expansion is pointedly a problem of highly integrated devices and techniques to reduce the bird's beak have been proposed, such as SILO (Sealed Interface Local Oxidation).

FIG. 1A to FIG. 1D illustrate the fabrication process sequence of an isolation region by using the conventional SILO method.

Referring to FIG. 1A, a first silicon nitride film 11 of 100~300 Å is grown on a semiconductor substrate 10, and an oxide film 12 of 300~700 Å and a second silicon nitride film 13 of 1000~2000 Å are sequentially formed by a low pressure CVD method. Next, to define the active element's region, the first silicon nitride film 11, the oxide film 12, and the second silicon nitride film 13 are selectively etched by a conventional photolithography method, thereby forming an opening.

FIG. 1B illustrates the formation of a channel stop layer 14 by ion-implantation of the same conductive impurity as the substrate.

FIG. 1C illustrates the formation of a field oxide film 15 grown at a temperature of 1000° C. to a thickness of approximately 4000~8000 Å.

Referring to FIG. 1D, the second silicon nitride film 13, the oxide film 12, and the first silicon nitride film 11, which were used to selectively oxidize the substrate, are sequentially removed, completing the isolation process.

However, in the conventional SILO isolation method, highly concentrated impurities are implanted to prevent the punch-through between active elements, which occurs along the bordering surface between the field oxide film and the semiconductor substrate. But, since impurity concentration is also high at the edges of the channel stop layer, adjacent to the high concentration regions, there is a disadvantage in that the junction breakdown voltage of the active element is lowered.

SUMMARY OF THE INVENTION

Accordingly, in order to solve the above-mentioned problems of the conventional techniques, it is an object of the present invention to provide an isolation method for a semiconductor device which can prevent the characteristic deterioration of the junction breakdown voltage caused by the high concentration of impurities in the channel stop layer.

Also, it is another object of the present invention to provide an isolation method for a semiconductor device which can widen the effective isolation distance and thus prevent punch-through between active elements on the integrated circuit substrate.

To achieve the above objects, the method of the present invention comprises the steps of:

sequentially depositing a first silicon nitride film, an oxide film, and a second silicon nitride film on a semiconductor substrate, and then forming an opening to define a separation region between the elements;

forming a spacer at the edges of the opening, and then implanting impurities;

removing the exposed part of the first silicon nitride film, and then removing the spacer; and growing a field oxide film, and then sequentially removing the second silicon nitride film, the oxide film, and the first silicon nitride film.

Also, in the present invention, the spacer may be removed after the first silicon nitride film and even a part of the semiconductor substrate are removed during the step which removes the exposed portion of the first silicon nitride film and the spacer. Accordingly, the depth to which the field oxide film is buried is controlled by the etching depth of the substrate. To be specific, the effective isolation distance can be greater by increasing the depth to which the field oxide film is buried.

BRIEF DESCRIPTION OF THE DRAWINGS

The above objects and other advantages of the present invention will become more apparent by describing the preferred embodiments of the present invention with reference to the attached drawings, in which.

DETAILED DESCRIPTION OF THE INVENTION

FIGS. 2A to 2E illustrate the sequential fabrication process for an isolation region in a first preferred embodiment according to the present invention.

Figure 1A:
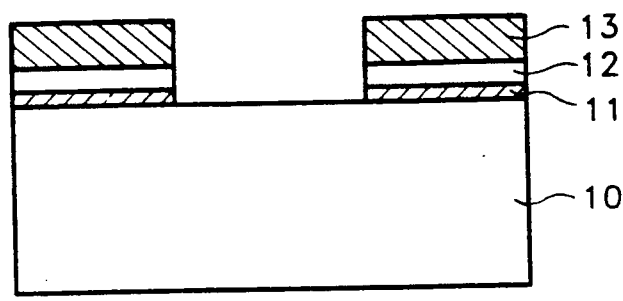
FIGS. 1A to 1D illustrate the sequential fabrication process for an isolation region using the conventional SILO method.
Figure 1B:
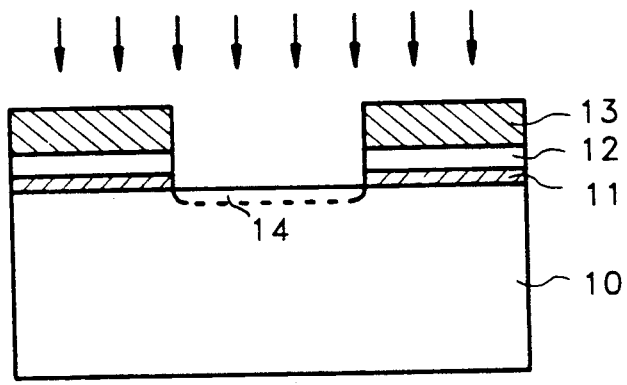
Figure 1C:
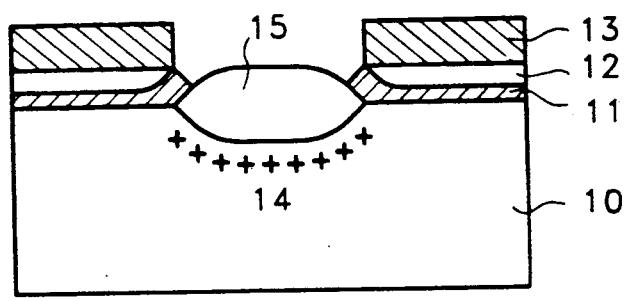
Figure 1D:
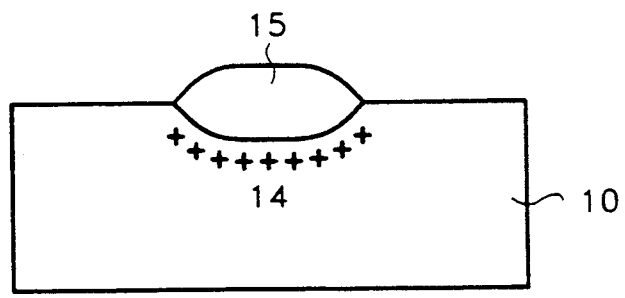
Figure 2A:
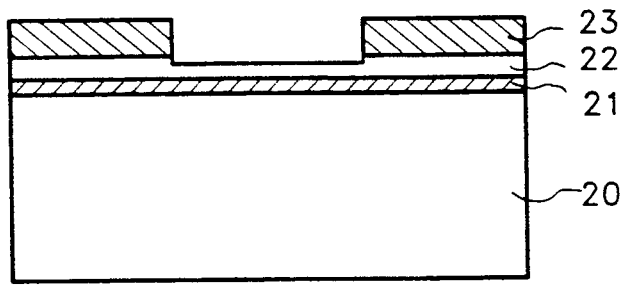
FIGS. 2A to 2E illustrate one preferred embodiment of the sequential fabrication process for an isolation region according to the present invention.

Referring to FIG. 2A, a first silicon nitride film 21 of 100~300 Å is grown on a semiconductor substrate 20, and then an oxide film 22 of 300~700 Å and a second silicon nitride film 23 of 1000~2000 Å are sequentially formed by a low pressure CVD method. After that, to define an isolation region, the second silicon nitride film 23 and part of the oxide film 22 are etched by a conventional photolithography method, thereby forming an opening.

Figure 2B:
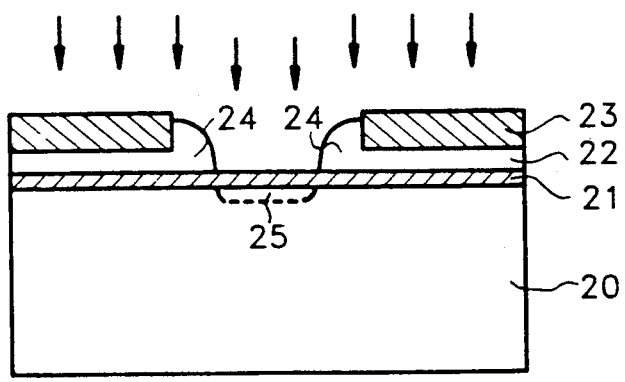

FIG. 2B illustrates the formation of a spacer 24 and a channel stop layer 25, in which an oxide film of 1500~2500 Å is formed after the step shown in FIG. 2A, and is anisotropically etched to form a spacer 24. Then, as indicated by the downward arrows, conductive impurities of the same polarity as the substrate 20 are ion-implanted through the first silicon nitride film 21 using the spacer 24 as a mask, thereby forming a channel stop layer 25.

Figure 2C:
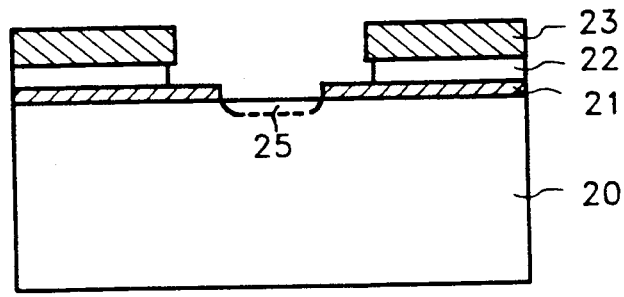

With reference to FIG. 2C, the exposed part of the silicon nitride film 21 is removed by a dry etching method, and the spacer 24 is then removed by a wet etching method.

Figure 2D:
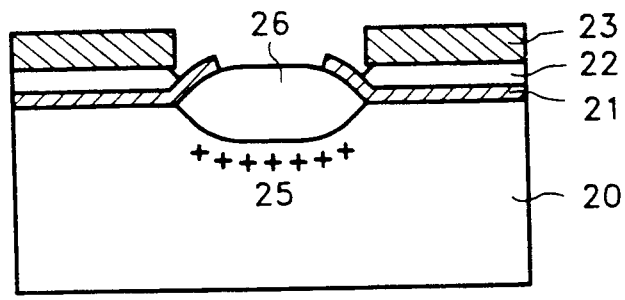

FIG. 2D illustrates the formation of a field oxide film 26 grown at a temperature of approximately 950°~1000° C.

Figure 2E:
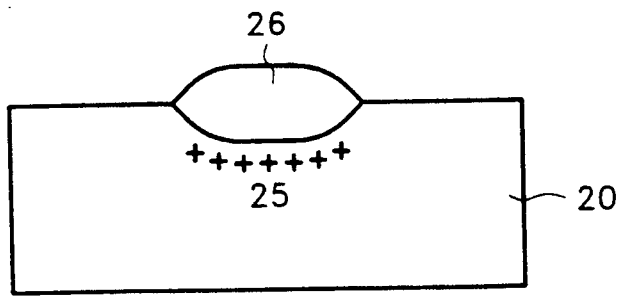

Referring to FIG. 2E, the second silicon nitride film 23, the oxide film 22, and the first silicon nitride 21, which have been used to selectively grow the field oxide film 26, are sequentially removed, thereby completing the process.

As described above, the oxide film spacer is formed to act as a mask during ion-implantation. Accordingly, even with greater ion density in the channel stop layer, the spacer prohibits the channel stop layer from extending to the high concentration region, thereby preventing the deterioration of the junction breakdown voltage characteristic.

FIGS. 3A to 3E illustrate the sequential fabrication process of an isolation region in a second preferred embodiment according to the present invention.

Figure 3A:
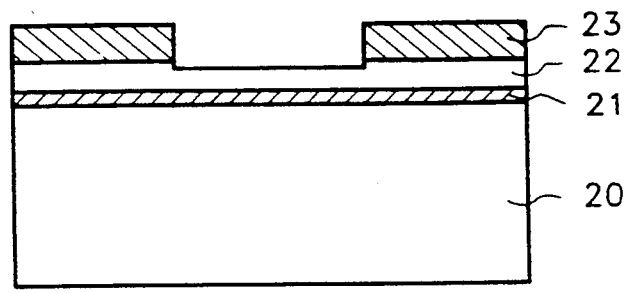
FIGS. 3A to 3E illustrate a second preferred embodiment of the sequential fabrication process for an isolation region according to the present invention.

Similar to the same steps in FIG. 2A, FIG. 3A shows a first silicon nitride film 21 of 100~300 Å, an oxide film 22 of 300~700 Å, and a second silicon nitride film 23 of 1000~2000 Å sequentially formed on the semiconductor substrate 20. Then, the second silicon nitride film 23 and part of the oxide film 22 are etched by a conventional photolithography method so as to form an opening which defines an isolation region.

Figure 3B:
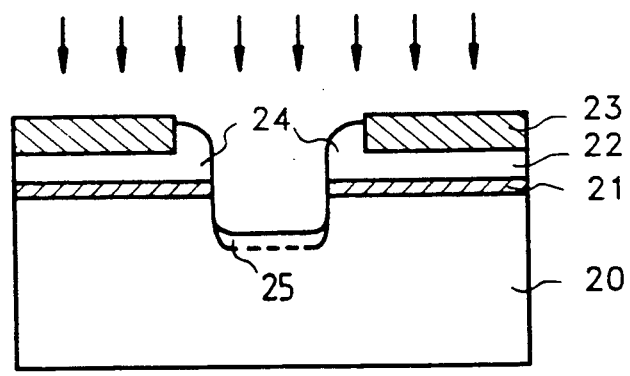

FIG. 3B illustrates the formation of the spacer 24 and the channel stop layer 25, in which the oxide film of 1500~2500 Å is formed after the steps shown FIG. 3A, and is anisotropically etched to form the spacer 24. Then, the exposed first silicon nitride film 21 and part of the semiconductor substrate 20 between the spacers 24 are removed by a dry etching method, and, as indicated by the downward arrows, conductive impurities of the same polarity as the semiconductor substrate 20 are then implanted using the spacer 24 as a mask to form a channel stop layer 25.

Figure 3C:
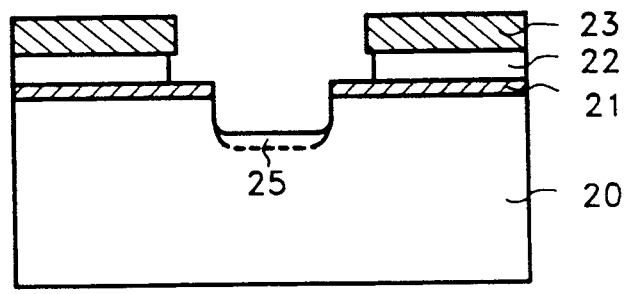

FIG. 3C illustrates the removal of the spacer 24 by a wet etching method.

Figure 3D:
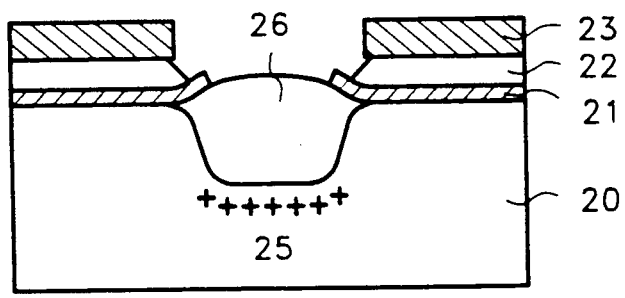

FIG. 3D illustrates the formation of a field oxide film 26 grown at a temperature of 950°~1000° C.

Figure 3E:
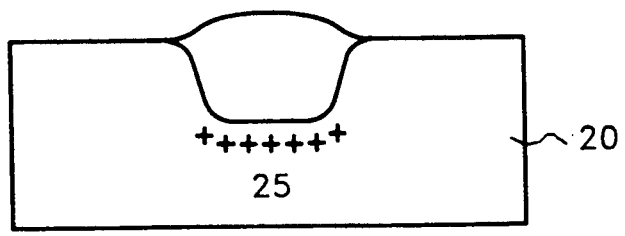

Referring to FIG. 3E, the second silicon nitride film 23, the oxide film 22, and the first silicon nitride film 21, which have been used to selectively grow the field oxide film 26, are sequentially removed, thereby completing the process.

As described above, in the second embodiment, after the spacer formation process, the exposed semiconductor substrate is etched to a specific depth, thereby increasing the depth to which the field oxide film is buried and resulting in an increase in the effective isolation distance between the active elements.

FIGS. 4A to 4E illustrate the sequential fabrication process of the isolation region in a third preferred embodiment according to the present invention.

Figure 4A:
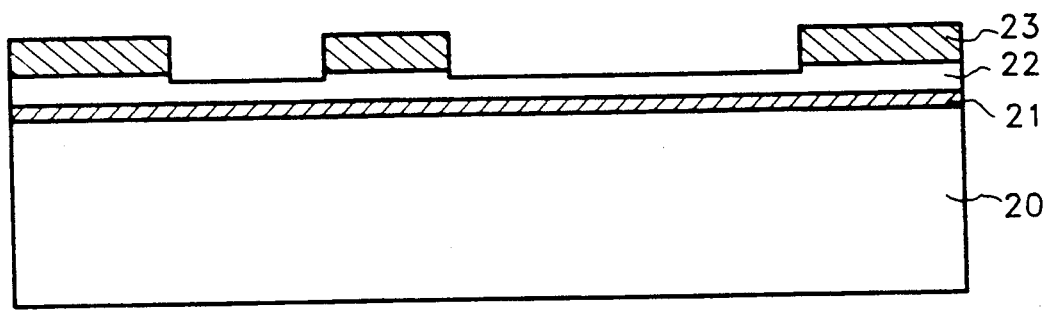
FIGS. 4A to 4E illustrate a third preferred embodiment of the sequential fabrication process for an isolation region according to the present invention.

Referring to FIG. 4A, after a first silicon nitride film 21 of 100~300 Å, an oxide film 22 of 300~700 Å, and a second silicon nitride film 23 of 1000~2000 Å are sequentially formed on the substrate 20, the second silicon nitride film 23 and part of oxide film 22 are etched to form separate openings.

Figure 4B:
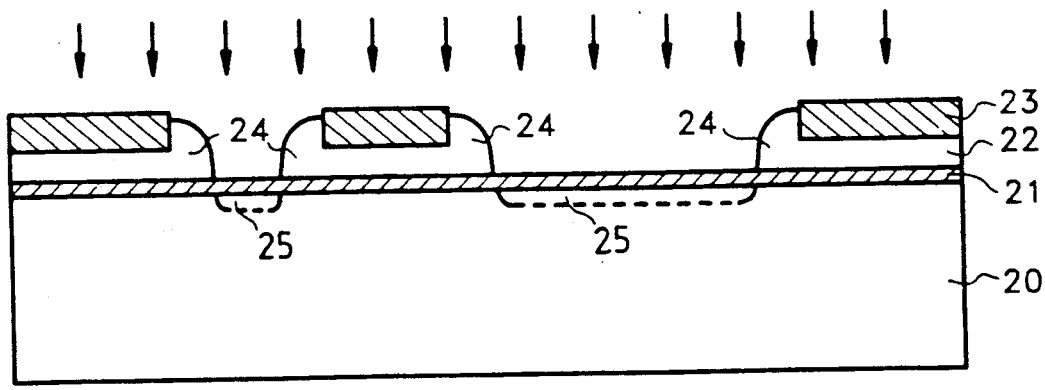

Referring to FIG. 4B, after the steps shown FIG. 4A, an oxide film of 1500~2500 Å is formed in the openings, and spacers 24 are then formed by an anisotropic etching method. Then, conductive impurities of the same polarity as the semiconductor substrate are ion-implanted as represented by the arrows using the spacer 24 as a mask.

Figure 4C:
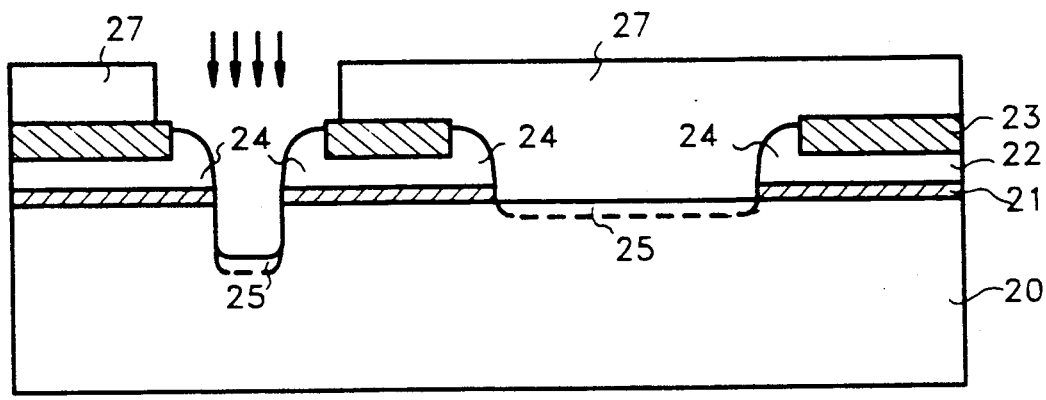

Referring to FIG. 4C, after the first silicon nitride film 21 exposed between the spacers 24 is removed by dry etching method, a photoresist 27 is coated over the entire area except the parts in which the narrow field oxide film will be grown. Then, the exposed semiconductor substrate 20 is removed by the dry etching method, and a second impurity is then implanted, as indicated by additional arrows.

Figure 4D:
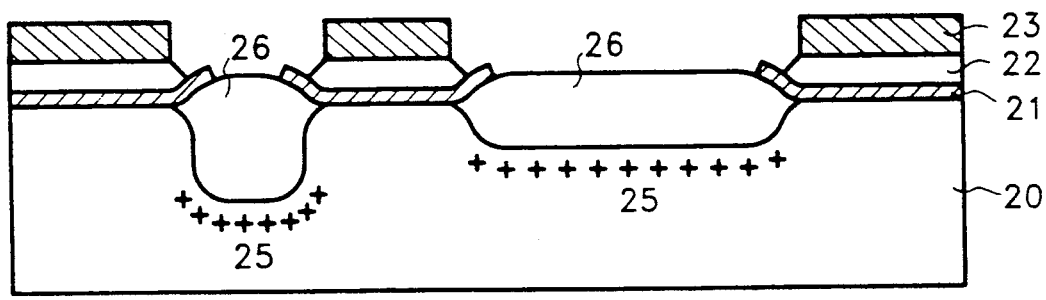

FIG. 4D illustrates the formation process of the field oxide film 26, in which the photoresist 27 and the spacer 24 are sequentially removed, and the field oxide film is then grown at a temperature of 950~1000 Å.

Figure 4E:
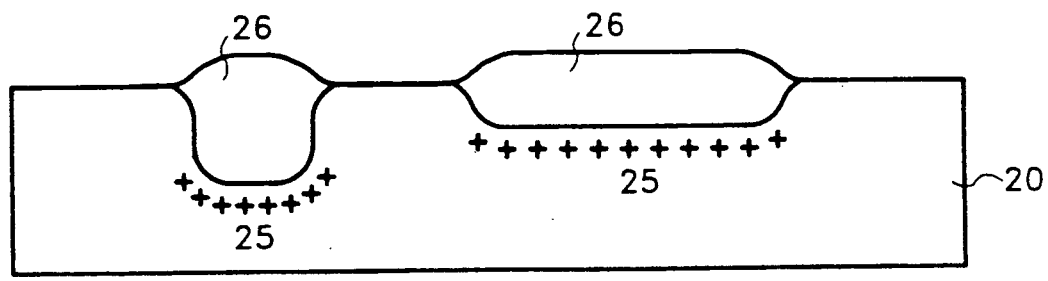

Referring to FIG. 4E, the second silicon nitride film 23, the oxide film 22, and the first silicon nitride film 21, which were used to selectively grow the field oxide film 26, are sequentially removed, thereby completing the isolation process.

As described above, the field oxide film is buried to be grown at a deeper portion of the substrate, thereby improving the step coverage with a peripheral circuit.

In all of the above embodiments of the present invention, to control the size of the spacer in the formation process of an opening, the second oxide film is formed after the first silicon nitride film, the first oxide film and the second silicon nitride film are formed, and then the second oxide film, the second silicon nitride film and a portion of the first oxide film are anisotropically etched to form the opening.

As described above, according to the present invention, while being grown, the field oxide film can be prevented from spreading sideways by the first silicon nitride film, and bird's beak effect can be reduced, thereby minimizing the size of the isolation region. Also, since stress at the edges of the field oxide film are lighter, the generation of crystal defects is reduced, thereby improving isolation characteristics and decreasing leakage current.

What is claimed is:

1. An isolation method for a semiconductor device comprising the steps of:
   sequentially depositing a first silicon nitride film, a first oxide film, and a second silicon nitride film on a semiconductor substrate, and then forming an opening in said second silicon nitride film and part of the thickness of said first oxide film to define an isolation region;
   forming a spacer at side edges of said opening, and then implanting impurities into the semiconductor substrate using the spacer as a mask;
   removing an exposed part of said first silicon nitride film, and then removing the spacer; and growing a field oxide film at said isolation region of said substrate, and then sequentially removing said second silicon nitride film, said first oxide film, and said first silicon nitride film.

2. An isolation method for a semiconductor device as claimed in claim 1, wherein said opening is formed by etching said second silicon nitride film and part of said first oxide film.

3. An isolation method for a semiconductor device as claimed in claim 1, wherein said spacer is formed of oxide film.

4. An isolation method for a semiconductor device as claimed in claim 3, wherein said spacer oxide film is formed on said first oxide film in said opening, and said spacer oxide film and said first oxide film are anisotropically etched by a dry etching method to form said spacer.

5. An isolation method for a semiconductor device as claimed in claim 1, wherein in the process for forming said opening, said first silicon nitride film, said first oxide film, said second silicon nitride film, and a second oxide film are sequentially formed on said semiconductor substrate to form an opening so as to define an isolation region.

6. An isolation method for a semiconductor device comprising the consecutive steps of:
sequentially forming a first silicon nitride film, a first oxide film, and a second silicon nitride film on a semiconductor substrate, and then forming an opening in said second silicon nitride film and part of the thickness of said first oxide film to define an isolation region;
forming a spacer at side edges of said opening, and etching the remaining portion of said first oxide film, said first silicon nitride film and part of said semiconductor substrate which are exposed between said side edges, and then implanting impurities in said substrate using said spacer as a mask;
removing said spacer; and
growing a field oxide film at said isolation region of said substrate, and sequentially removing said second silicon nitride film, said first oxide film, and said first silicon nitride film.

7. An isolation method for a semiconductor device as claimed in claim 6, wherein said opening is formed by etching said second silicon nitride film and part of said first oxide film.

8. An isolation method for a semiconductor device as claimed in claim 6, wherein said spacer is composed of oxide film.

9. An isolation method for a semiconductor device as claimed in claim 8, wherein said spacer oxide film is formed on said second silicon nitride film in said opening, and is anisotropically etched by a dry etching method to form said spacer.

10. An isolation method for a semiconductor device as claimed in claim 6, wherein in the process for forming said opening, said first silicon nitride film, said first oxide film, said second silicon nitride film, and a second oxide film are sequentially formed on said semiconductor substrate to form an opening so as to define an isolation region.

11. An isolation method for a semiconductor device, which has a first region for a relatively narrow field oxide film and a second region for a relatively wide field oxide film, comprising the consecutive steps of:
sequentially forming a first silicon nitride film, a first oxide film, and a second silicon nitride film on a substrate, and then forming openings in a first region and a second region of said second silicon nitride film and part of the thickness of said first oxide film to define isolation regions;
forming a spacer at side edges of said openings, and then implanting a first impurity in said substrate at said openings using said spacer as a mask;
removing the first silicon nitride film exposed between said spacers in said first region, coating portions other than the isolation region of the first region with a photoresist, removing a part of the exposed semiconductor substrate of the first region, and implanting a second impurity in the substrate below said first region; and
growing a field oxide film in said substrate at said first and second regions after sequentially removing said photoresist and said spacers, and then sequentially removing said second silicon nitride film, said first oxide film, and said first silicon nitride film.

12. An isolation method for a semiconductor device as claimed in claim 11, wherein said openings are formed by etching said second silicon nitride film and part of the thickness of said first oxide film.

13. An isolation method for a semiconductor device as claimed in claim 11, wherein said spacer is composed of oxide film.

14. An isolation method for a semiconductor device as claimed in claim 13, wherein said spacer oxide film is formed on said second silicon nitride film in said opening, and is anisotropically etched by a dry etching method to form said spacer.

15. An isolation method for a semiconductor device as claimed in claim 11, wherein in the process for forming said opening, said first silicon nitride film, said first oxide film, said second silicon nitride film, and a second oxide film are sequentially formed on said semiconductor substrate to form an opening so as to define an isolation region.

* * * * *